United States Patent
Suyama et al.

(10) Patent No.: US 6,285,553 B1
(45) Date of Patent: Sep. 4, 2001

(54) MOUNTING STRUCTURE FOR AN LSI

(75) Inventors: Takayuki Suyama; Hironobu Ikeda, both of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/370,879

(22) Filed: Aug. 10, 1999

(30) Foreign Application Priority Data

Aug. 11, 1998 (JP) .................................................. 10-226868

(51) Int. Cl.$^7$ ....................................................... H05K 7/20
(52) U.S. Cl. .......................... 361/719; 361/704; 361/707; 174/16.3; 174/252; 165/80.3; 165/185
(58) Field of Search ................................... 361/704, 705, 361/707, 709, 710, 712, 713, 717–719, 760, 767; 257/706, 707, 712, 713, 717; 174/16.3; 165/80.2, 80.3, 185

(56) References Cited

U.S. PATENT DOCUMENTS

| 4,918,571 | * | 4/1990 | Grabbe | 361/718 |
|---|---|---|---|---|
| 5,311,060 | * | 5/1994 | Rostoker et al. | 257/796 |
| 5,430,611 | * | 7/1995 | Patel et al. | 361/705 |
| 5,473,510 | * | 12/1995 | Dozier, II | 361/719 |
| 5,528,462 | * | 6/1996 | Pendse | 361/767 |
| 5,838,064 | * | 11/1998 | Shimada et al. | 257/718 |
| 6,078,506 | | 6/2000 | Sugahara | 361/783 |
| 6,084,178 | * | 7/2000 | Cromwell | 174/35 R |

FOREIGN PATENT DOCUMENTS

| 359144153A | * | 8/1984 | (JP) . |
|---|---|---|---|
| 5-41473 | | 2/1993 | (JP) . |
| 9-326450 | | 12/1997 | (JP) . |
| 10-223698 | | 8/1998 | (JP) . |

* cited by examiner

Primary Examiner—Leo P. Picard
Assistant Examiner—Boris L. Chervinsky
(74) Attorney, Agent, or Firm—Foley & Lardner

(57) ABSTRACT

A PCB is fixed to a PCB stiffener to be held thereby, while an LSI is fixed to an LSI stiffener to be held thereby. The distal ends of four supporting bars provided in the LSI stiffener are screwed on the PCB stiffener, whereby the two stiffeners are firmly integrated with each other to be prevented from being warped. Since a heat sink can be mounted through tapped holes provided in the LSI stiffener, even if the PCB is a thin board such as a build-up substrate, it is possible to mount the heat sink without any difficulties.

14 Claims, 2 Drawing Sheets

FINISHED

MOUNTING STRUCTURE FOR AN LSI

BACKGROUND OF THE INVENTION

1. Field of the Invention

The present invention relates to a mounting structure for an LSI suitable for use in mounting a bare LSI chip on a printed circuit board.

2. Description of the Related Art

Conventionally, a bare LSI (Large Scale Integrated Circuit) chip was mounted on a substrate having a thermal expansion coefficient relatively close to that of the chip, e.g., on a ceramic substrate (its thermal expansion coefficient is within the range of 7 to 9 ppm). In recent years, however, for the purpose of lowering prices, there has been established the technology of mounting a bare LSI chip on a build-up substrate employing a printed circuit board.

However, since the thermal expansion coefficients printed circuit boards is within the range of about 14 to about 16 ppm which is larger than those of ceramic substrates and also the printed circuit boards is softer than any of the ceramic substrates, when connecting an LSI to a printed circuit board, the reliability in connection backed by the temperature cycling tests and the like can not be ensured due to occurrence of the In the worst scenario, the LSI may be damaged cases.

Then, while there has been adopted the technique of filling the gap defined between an LSI and a printed circuit board with resin to integrate the LSI and the printed circuit board with each other in order to ensure the connection reliability, in this case as well, there are many limits in terms of materials of resin, the size of an LSI and the like.

In particular, when the size of an LSI is increased, the difference in the thermal expansion coefficient between the LSI and the printed circuit board is large though the LSI and the printed circuit board are integrated with each other by filling the gap defined therebetween with resin, and hence the occurrence of the warpage due to the bimetal effect can not be prevented. When the warpage occurs, this exerts a bad influence on the connection reliability of the LSI, and also if the warpage exerts an influence on the overall printed circuit board, then this will exert in turn a bad influence on the reliability of other components.

In addition, since the amount of calorification is increased when the size of the LSI is increased, a heat sink is required. However, since the printed circuit board itself is thin and does not have the durability enough to support the heat sink, which is heavy for the printed circuit board, it is impossible to apply any of good way of heat sinking the printed circuit board.

Heretofore, while there has been known the method of fixing a heat sink employing the stiffener on the rear face of the printed circuit board in order to fix the heat sink such as an LGA (Land Grid Array) or a BGA, it is impossible to obtain the sufficient effect.

In the light of the foregoing, the present invention was made in order to solve the above-mentioned problems associated with the prior art, and it is therefore an object of the present invention to provide a mounting structure for an LSI mounting, which structure is capable of removing any of the disadvantages as described above to improve the reliability in connection between an LSI and a printed circuit board and capable of holding a heat sink without any of difficulties.

SUMMARY OF THE INVENTION

According to an aspect of the invention, there is provided a mounting structure for an LSI which comprises: a first frame and a second frame. The first frame is for mounting and supporting a printed circuit board along a periphery of the printed circuit board, which carries the LSI. The LSI can be mounted to the circuit board with a solder. The second frame is for supporting the printed circuit board surrounding the LSI and fixing to the first frame. The printed circuit board is positioned between the first and second frames when the second frame is fixed to the first frame. The second frame has a stiffener that supports the printed circuit board at least around the LSI when the second frame is fixed to the first frame.

The second frame is provided with fixing means for fixing a heat sink for cooling the LSI.

The printed circuit board is a thin build-up substrate.

The second frame is provided with a plurality of supporting bars extending from the stiffener. The distal ends of the supporting bars can be fixed to the first frame along the periphery of the circuit board. The first frame can include a recess for accommodating the printed circuit board so that the periphery of the circuit board is seated in the first frame.

The fixing means are comprised of screws.

The first and second frames are each made of hard metal.

The present invention also includes a combination of the above-described LSI, the circuit board, and the mounting structure.

BRIEF DESCRIPTION OF THE DRAWINGS

Other features and objects will become apparent from the following description when taken in conjunction with the accompanying drawings, in which.

DETAILED DESCRIPTION OF THE PREFERRED EMBODIMENT

The preferred embodiment of the present invention will hereinafter be described in detail with reference to the accompanying drawings.

Figures 1A, 1B:
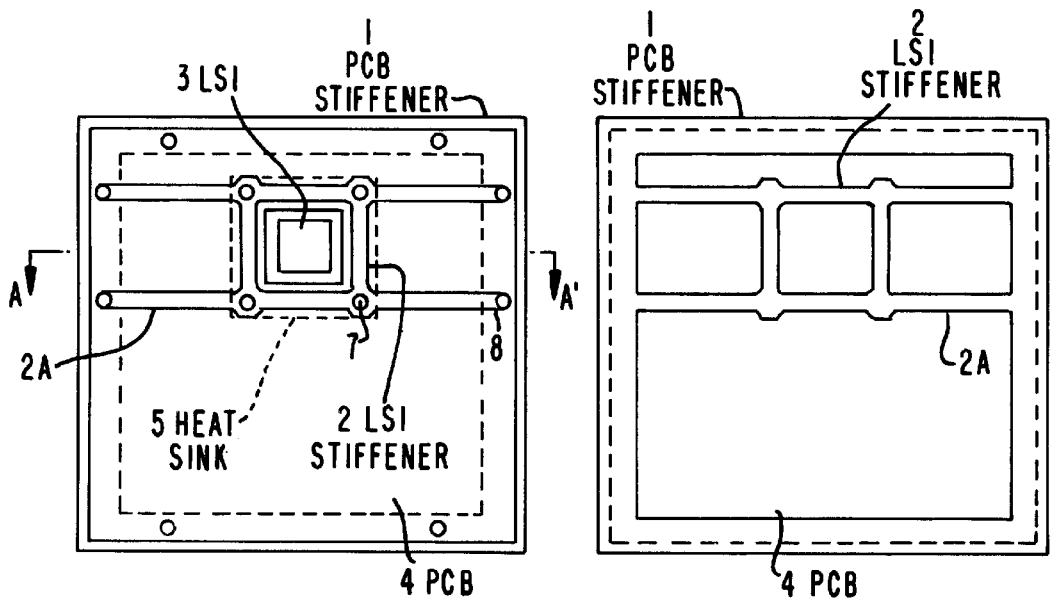
FIGS. 1A and 1B are respectively a plan view and a view of a rear face of an embodiment of a mounting structure for an LSI according to the present invention.
Figure 2:
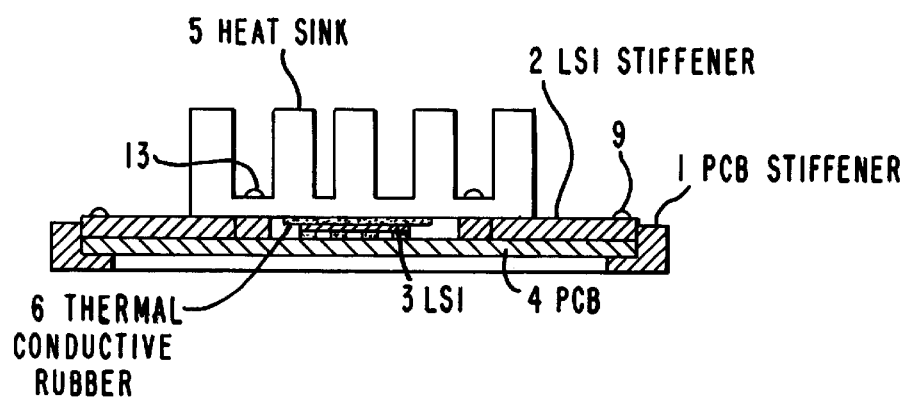
FIG. 2 is a cross sectional view taken generally along line II—II of FIG. 1A.

FIG. 1A is a plan view showing an embodiment of a mounting structure for an LSI according to the present invention, and FIG. 1B is a view of a rear face of the mounting structure for an LSI of the present embodiment. In addition, FIG. 2 is a cross sectional view taken generally on line along line II—II of FIG. 1A.

In FIG. 1, an LSI 3 has the outer size of 20 mm$^2$ for example, and its I/O pads are arranged on a predetermined area at pitches of about 0.2 mm for example.

A printed circuit board 4 (hereinafter, referred to as "a PCB" for short, when applicable) can be any of the printed circuit boards as long as it is such that in order to mount a bare chip of an LSI having pads, which are arranged at pitches of 0.2 mm, in the form of a flip chip, the corresponding pads can be formed on the surface thereof. In the present embodiment, a build-up substrate for which the fine patterning can be carried out is employed. The build-up substrate is such that a build-up layer is formed on each of the two sides of a core board and its general thickness is about 1.6 mm. In addition, the outer size of the PCB 4 is 100 mm$^2$ for example.

A PCB stiffener 1 as a second frame for holding the PCB 4 is obtained by processing hard metal such as stainless or 42-alloy so as to obtain the outer size of 1.6 mm². In the present embodiment, the outer groove for accommodating therein the PCB 4 having the outer size of 100 mm² is obtained by processing the PCB stiffener 1 so as to form therein a stepped portion. After having set the PCB 4 so as to be accommodated in the PCB stiffener 1 through the stepped portion, the outer periphery thereof is fixed with the screws. In addition, while a hole with 80 mm² inner size is bored through the bottom portion of the stiffener 1, which has a shape complementary to an LSI stiffener 2, which is integrated with the PCB stiffer 1. This PCB stiffener 1 has the thickness of 10 mm at a thick portion and has the thickness of 5 mm at a thin portion.

The LSI stiffener 2 as the first frame for holding the LSI 3 is made of hard metal in a similar manner to the case of the PCB stiffener 1. In the present embodiment, the LSI stiffener 2 is made in such a way that for example, a rod-like member which is 10 mm in width and is 10 mm in thickness is processed so as to have the size of 50 mm² enough to surround the periphery of the LSI 3 to have the shape in which four supporting bars 2A are projected to the outside of the frame. In each of the crossing portions of the supporting bars 2, which are located so as to surround the periphery of the LSI, a tapped hole 7 with 4 mm diameter is formed therethrough. In addition, in each of the distal ends of the supporting bars 2, a tapped hole 8 with 4 mm diameter is formed so as to be able to fix the associated supporting bar 2 to the PCB stiffener 1.

Next, a method of assembling a mounting structure for an LSI according to the present embodiment will hereinafter be described in detail with reference to FIGS. 2 and 3.

In the case where the bare chip of the LSI 3 is mounted to the PCB 4 in the form of a flip chip, when carrying out the connection with eutectic solder, both of the LSI 3 and the PCB 4 need to be heated near about 180° C. degrees as the eutectic point of the solder. At this time, the thermal expansion coefficient of the PCB 4 made of an organic material is in the range of 15 to 17 ppm, whereas the thermal expansion coefficient of silicon as a material for the LSI 3 is around 3 ppm. Hence, it is understood that the difference in the thermal expansion coefficient between the LSI 3 and the PCB 4 is considerably large. In particular, when the outer size of the LSI 3 is large, this difference is remarkable.

In the case of the present embodiment, since the outer size of the LSI 3 is 20 mm, the diagonal having the maximum length is about 28 mm, and hence the difference in the thermal expansion coefficient remarkably occurs between silicon and the PCB 4 in this area. If the temperature is changed from 20 degrees as the room temperature to 180° C. degrees as the eutectic point, then for the length of 28 mm, the printed circuit board will expand by 67 μm, and silicon will expand by 13 μm. Therefore, the PCB 4 and silicon are connected to each other by solder with the PCB 4 and silicon when they are expanded by 67 μm and 13 μm, respectively. If the temperature of both of the LSI 3 and the PCB 4 are freely decreased from the state of the 180° C. degrees temperature down to the room temperature, both of the PCB 4 and silicon become warped on the side of the PCB 4 having the larger contraction due to the bimetal effect since the connections therebetween are fixed. In this state, it is difficult to ensure the reliability for the connections, and also the large warpage results in the LSI being damaged.

First the PCB 4 is set in the PCB stiffener 1 and then the outer periphery are fixed at about four positions with screws. At this time, the pads for the LSI connection of the PCB 4 is supplied with the solder 10 (refer to FIG. 3A). As for the method of applying solder, there are various methods such as the plating as well as the printing and the reflow.

Next, the pad portions, on which the components other than the LSI are to be mounted, of the PCB 4 thus fixed are supplied with solder 11 by the screen printing technique. Next, only the LSI 3 to be mounted in the form of the bare chip is mounted on the LSI connecting pads, thereby carrying out the temporary fixing (refer to FIG. 3B). After completion of the temporary fixing, the LSI stiffener 2 is placed on the board, and then it is tightly fixed at the outer periphery thereof to the PCB stiffener 1 with the screws 9 (refer to FIG. 2), thereby integrating firmly the PCB stiffener 1 with the LSI stiffener 2 (refer to FIG. 3C). By fixing the PCB stiffener 1 to the LSI stiffener 2, it is possible to suppress the deformation, the warpage and the waviness of the overall PCB 4, or a part of the PCB 4 due to the connection with the LSI 3 against the temperature change caused by the reflow, the cooling and the like thereafter.

After completion of the fixing, the reflow is carried out for the overall PCB or only the LSI 3 to connect the LSI 3 to the PCB 4. After completion of the reflow, when flux is contained in solder, the cleaning is carried out, while in the case of the cleaningless solder or fluxless solder, no cleaning is carried out. After having confirmed the connection, the gap defined between the LSI and the PCB is sealed with resin, and under this state, components 12 other than the LSI are mounted on the pads, and then the reflow and the cleaning are carried out again (refer to FIG. 3D).

Figure 3A:
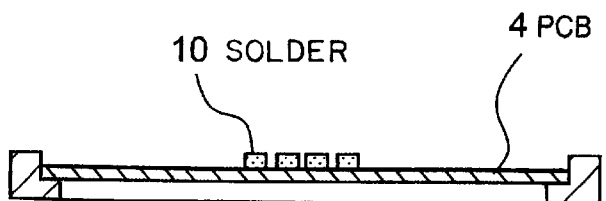
FIGS. 3A to 3E are respectively front elevational views showing a method of assembling a mounting structure for an LSI according to an embodiment of the present embodiment.
Figure 3B:
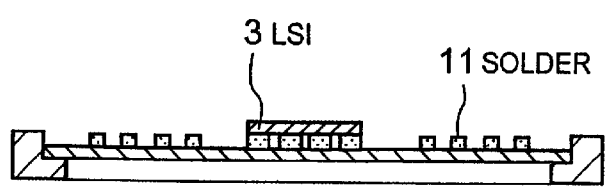
Figure 3C:
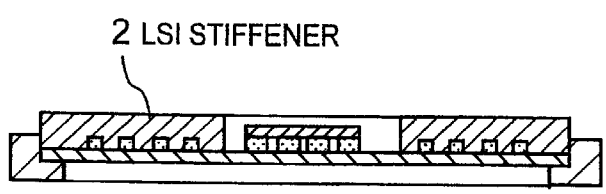
Figure 3D:
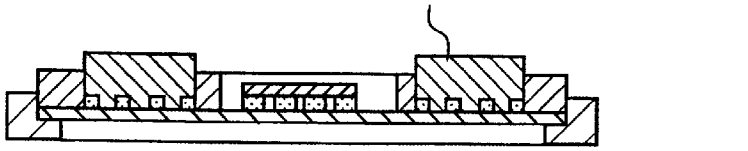
Figure 3E:
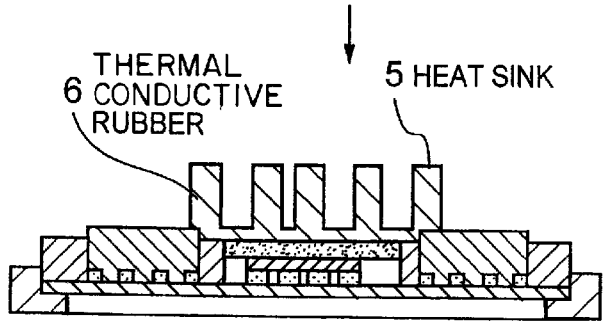

Finally, after the upper face of the LSI is covered with thermal conductive rubber 6, a heat sink 5 is placed thereon and then the corners of the heat sink 5 are fixed to a part of the LSI stiffener 2 with screws 13 (refer to FIG. 2 and FIG. 3E). At this time, the screws 13 pass through the PCB 4 to fix up to the LSI stiffener 2 on the rear face. When no through hole is allowed to be bored through the PCB 4, the heat sink 5 may also be fixed to only the stiffener on the surface.

As shown in FIG. 2 and FIG. 3E, since the heat sink 5 is supported by the firm LSI stiffener 2, which is fixed to the PCB stiffener 1, even when the amount of calorification of the LSI 3 is large and hence the large heat sink is forced to be employed, the weight of the heat sink 5 does not become a problem at all. In addition, since the LSI 3 and the PCB 4 are fixed by both of the LSI stiffener 2 and the PCB stiffener 1, no warpage occurs in both of the LSI 3 and the PCB 4.

As described above, the feature of the present invention is such that when the LSI 3 having the large outer size (about 20 mm² or more) is mounted on the PCB (its thickness is in the range of about 1 to about 2 mm) 4 formed of a build-up substrate or the like in the form of a flip chip, the warpage of the overall PCB is suppressed to hold the gap defined between the LSI and the PCB fixed to improve the connection reliability of solder supplied between the LSI and the PCB and at the same time, the heat sink for cooling the LSI is fixed and the unbalance due to mounting the heavy heat sink on the thin board is corrected by the frame on the outer periphery.

This results from the fact that since both of the PCB stiffener 1 and the LSI stiffener 2 are provided to be fixed to each other with screws, thereby removing the warpage and holding the gap defined between the LSI and the PCB fixed, and also the heat sink 5 can be fixed to the LSI stiffener 2, even the heavy heat sink 5 can be supported by the PCB stiffener 1.

In this connection, in the case as well where two or more bare LSIs are mounted on the PCB, by providing the frames of the LSI stiffeners by the number equal to the number of LSIs, it is possible to remove the warpage of the portion of the LSIs due to the mounting of the bare chips. In addition, the rear face portion of the LSI stiffener may have the shape which is held by the face.

As set forth hereinabove, according to the present invention, a frame to which an LSI is fixed is fixed to a frame to which a PCB is fixed to integrate both of the frames with each other, whereby the warpage due to the difference in the thermal expansion coefficient between the LSI and the PCB can be suppressed, and the reliability in connection of solder can be improved and also any of influences exerted on other components can be removed.

In addition, fixing means such as screwing means for the heat sink is provided in the frame to which the LSI is to be fixed, whereby even in the case of the thin PCB, the heat sink can be mounted thereto without any difficulties.

In addition, a plurality of supporting bars are provided in the frame to which the LSI is to be fixed and the distal ends thereof are fixed to the other frame, whereby the two frames can be firmly fixed to be integrated with each other.

While the present invention has been particularly shown and described with reference to the preferred embodiment, it will be understood that the various changes and modifications will occur to those skilled in the art without departing from the scope and true spirit of the invention. The scope of the invention is therefore to be determined sololy by the appended claims.

What is claimed is:

1. A mounting structure for an LSI, comprising:
    a first frame mounting and supporting a printed circuit board along a periphery of the printed circuit board, which carries said LSI; and
    a second frame supporting the printed circuit board surrounding the LSI and fixed to said first frame;
    wherein the printed circuit board is positioned between the first and second frames when the second frame is fixed to the first frame,
    wherein the second frame has a stiffener that supports the printed circuit board at least around the LSI when the second frame is fixed to the first frame.

2. A mounting structure as claimed in claim 1, wherein said second frame is provided with a fixing means for fixing a heat sink for cooling LSI.

3. A mounting structure as claimed in claim 1, wherein said printed circuit board is thin build-up substrate.

4. A mounting structure as claimed in claim 1, wherein said second frame is provided with a plurality of supporting bars extending from the stiffener, distal ends of the supporting bars are fixed to said first frame.

5. A mounting structure as claimed in claim 2, wherein said fixing means comprises screws.

6. A mounting structure as claimed in claim 1, wherein said first and second frames are made of hard metal.

7. A mounting structure as claimed in claim 4, wherein the supporting bars are fixed to the first frame along the periphery of the circuit board.

8. A mounting structure as claimed in claim 1, wherein the first frame includes a recess for accommodating the printed circuit board so that the periphery of the circuit board is seated in the first frame.

9. A mounting structure in combination with an LSI device, comprising:
    a printed circuit board;
    a first frame supporting and mounting the printed circuit board along a periphery of the printed circuit board;
    an LSI device fixed to the printed circuit board with a solder; and
    a second frame mounted to the first frame, with the printed circuit board positioned between the first and second frames,
    wherein the second frame has a stiffener that supports the first frame at least around the LSI device.

10. A mounting structure combination according to claim 9, further including a heat sink for cooling the LSI device, the heat sink being mounted to the second frame.

11. A mounting structure combination according to claim 9, wherein the printed circuit board is a thin build-up substrate.

12. A mounting structure combination according to claim 9, wherein the second frame further includes a plurality of supporting bars extending from the stiffener, distal ends of the supporting bars being fixed to the first frame.

13. A mounting structure combination according to claim 9, wherein the first and second frames are made of hard metal.

14. A mounting structure combination according to claim 12, wherein the supporting bars are fixed to the first frame along the periphery of the circuit board.

* * * * *